US006236366B1

(12) United States Patent
Yamamoto et al.

(10) Patent No.: US 6,236,366 B1
(45) Date of Patent: May 22, 2001

(54) HERMETICALLY SEALED SEMICONDUCTOR MODULE COMPOSED OF SEMICONDUCTOR INTEGRATED CIRCUIT AND ANTENNA ELEMENT

(75) Inventors: Toshio Yamamoto, Tokyo; Yasutake Hirachi, Musashino, both of (JP)

(73) Assignee: Olympus Optical Co., Ltd., Tokyo (JP)

( * ) Notice: Subject to any disclaimer, the term of this patent is extended or adjusted under 35 U.S.C. 154(b) by 0 days.

(21) Appl. No.: 08/919,028

(22) Filed: Aug. 27, 1997

(30) Foreign Application Priority Data

Sep. 2, 1996 (JP) .................................. 8-231685

(51) Int. Cl.[7] .................................................. H01Q 1/38
(52) U.S. Cl. .................. 343/700 MS; 343/777; 455/280; 455/347; 331/48
(58) Field of Search ............... 343/777, 700 MS, 343/368, 860; 174/250; 331/48; 455/347, 193.1, 280

(56) References Cited

U.S. PATENT DOCUMENTS

| | | | |
|---|---|---|---|
| 4,760,351 | * | 7/1988 | Newell et al. ............... 331/48 |
| 5,023,624 | * | 6/1991 | Heckman et al. ........... 343/860 |
| 5,140,110 | * | 8/1992 | Nakagawa et al. .......... 174/250 |
| 5,276,455 | * | 1/1994 | Fitzsimmons et al. ...... 343/777 |
| 5,376,942 | * | 12/1994 | Shiga ..................... 343/700 MS |
| 5,381,157 | * | 1/1995 | Shiga ..................... 343/700 MS |
| 5,450,090 | * | 9/1995 | Gels et al. ............... 343/700 MS |
| 5,488,380 | * | 1/1996 | Harvey et al. ............. 343/368 |
| 5,608,263 | * | 3/1997 | Drayton et al. ............ 257/728 |

FOREIGN PATENT DOCUMENTS

| | | |
|---|---|---|
| 56-17842 | 4/1981 | (JP) . |
| 57-141944 | 9/1982 | (JP) . |
| 57-44241 | 9/1982 | (JP) . |
| 61-48201 | 3/1986 | (JP) . |
| 63-316905 | 12/1988 | (JP) . |
| 6-77729 | 3/1994 | (JP) . |
| 9-153839 | 6/1997 | (JP) . |

OTHER PUBLICATIONS

Y. Itoh et al; "A W–Band Monolithic Low Noise AlGaAs/InGaAs Pseudomorphic Hemt Amplifier Mounted On A Small Hermetically Sealed Package with Waveguide Interface"; 1995; pp. 207–210; 1995 IEEE MTT–S Digest.
T. Satio et al; "A 60 GHz Receiver Module for High–Speed Transmission Systems"; Institute of Electronics, Information and Communication Engineers, Aug. 15, 1995; p. 142.

* cited by examiner

Primary Examiner—Lee Nguyen
Assistant Examiner—Simon Nguyen
(74) Attorney, Agent, or Firm—Frishauf, Holtz, Goodman, Langer & Chick, P.C.

(57) ABSTRACT

A semiconductor module having a built-in antenna element for use in a system of a band of millimeter-waves or quasi-millimeter-waves comprises a substrate, an antenna element, a semiconductor integrated circuit, and a hermetically sealing portion. The antenna element is mounted on one side of the substrate. The semiconductor integrated circuit is also formed on the same side of the substrate as of the antenna element. The semiconductor integrated circuit includes at least either of a transmitter signal processing circuit composed mainly of an amplifier circuit and a frequency converter circuit for processing a signal which is exploited in the system of the band of millimeter-waves or quasi-millimeter-waves and transmitted to the antenna element, and a receiver signal processing circuit composed mainly of an amplifier circuit and a frequency converter circuit for processing a signal which is received by the antenna element and exploited in the system of the band of millimeter-waves or quasi-millimeter-waves. The hermetically sealing portion is designed for hermetically sealing the antenna element and the semiconductor integrated circuit formed on the substrate within a common space defined by a boundary surface or the side of the substrate while the transmissivity of radio waves to the antenna element for the system of the band of millimeter-waves or quasi-millimeter-waves is maintained.

15 Claims, 8 Drawing Sheets

HERMETICALLY SEALED SEMICONDUCTOR MODULE COMPOSED OF SEMICONDUCTOR INTEGRATED CIRCUIT AND ANTENNA ELEMENT

BACKGROUND OF THE INVENTION

The present invention relates to a semiconductor module provided with a built-in antenna element and more particularly, a semiconductor module for radio communications or distance measurements which has a built-in antenna element suited for a radio communications system or a distance/speed measurements system using a millimeter-wave band ranging from 30 GHz to 300 GHz and a quasi-millimeter -wave band ranging from 18 GHz to 30 GHz, for example.

As known, a radio communications system of heterodyne type substantially comprises a mixer circuit, frequency converter circuit including local oscillators, an amplifier circuit, and an antenna element, for example.

In a conventional radio communications system using frequencies lower than quasi-millimeter-waves, a plurality of devices, each having the above components, except the antenna element, sealed in a package or casing, are connected to each other by external terminals mounted to the casings of the devices thus constituting a subsystem for radio communications.

A technique is also known that a combination of the frequency converter circuit and the amplifier circuit which is embodied as a microwave integrated circuit is mounted together with the antenna element in a wave-guide which is a microwave circuit for transmission of a microwave through the waveguide (for example, as disclosed in Jpn. Pat. Appln. KOKOKU Publication No. 56-17842 or No. 57-44241).

A phased array antenna is known in which a plurality of transmitter and receiver antennas are arranged two-dimensionally.

In common, such a phased array antenna includes cables and connectors for power supply from a microwave integrated circuit to an antenna element.

Accordingly, the above mentioned prior art systems will be troublesome in carrying out a maintenance work even worse, the signal processing ability of such prior art systems may decline due to joint degradation or deterioration with time of the cables and connectors.

The prior art systems also have disadvantages in that there is interference between the antenna element and the microwave circuit and in that the distance between the antenna elements in a two-dimensional arrangement is not small.

The former disadvantage which is inevitable in the power supply from the microwave circuit to the antenna element, may be eliminated by means of a construction which is depicted in Jpn. Pat. Appln. KOKAI Publication No. 63-316905 as shown in FIGS. 9A and 9B.

FIGS. 9A and 9B are identical to FIGS. 1 and 2 of the prior art disclosed in the Publication No. 63-316905.

As shown in FIGS. 9A and 9B, one of antenna elements which constitute a phased array antenna is connected to a microwave circuit.

Referring to FIG. 9A, the antenna element is denoted by 21 while a package is denoted by 22.

The package 22 contains the microwave integrated circuit 23.

Referring to FIG. 9B which is an enlargement of FIG. 9A, the microwave integrated circuit 23 consisting mainly of a microwave IC chip 23a is welded by a dose of solder 22b to the package 22.

The microwave integrated circuit 23 also has a via-hole 23c as the main passage and via-holes 23d for grounding a back electrode 23e in the shortest distance.

More specifically, a transmitter/receiver terminal 23f of the microwave integrated circuit 23 is electrically connected through the via-hole 23c of the main passage to the antenna element 21.

This arrangement can eliminate the former disadvantage derived from the cables and connectors between the antenna element and the transmitter/receiver module.

For solving the disadvantages relating to interference between the antenna element and the microwave circuit and the small distance between the antenna elements in a two-dimensional arrangement, a method is known as disclosed in Jpn. Pat. Appln. KOKAI Publication No. 6-77729.

FIGS. 10A and 10B are identical to FIGS. 1(a) and 1(b) of the prior art depicted in the Jpn. Pat. Appln. KOKAI Publication No. 6-77729.

Shown in FIGS. 10A and 10B similar to FIGS. 9A and 9B are one of antenna elements which constitute a phased array antenna and a microwave circuit joined integrally with the antenna.

FIG. 10A is a perspective view and FIG. 10B is a cross sectional view taken along the line XB—XB of FIG. 10A.

As shown in FIGS. 10A and 10B, the antenna element denoted by numeral 33 is mounted on a dielectric substrate 31 having a ground 32 provided on the back side thereof and a semiconductor circuit board 34 including a microwave circuit composed using portions of the dielectric substrate 31 and the ground 32.

The antenna element 33 is coupled to the microwave circuit via a coupling aperture 35 provided in the ground 32.

The construction shown in FIGS. 10A and 10B like that shown in FIGS. 9A and 9B allows the microwave circuit and the antenna element to be located on the front and back sides of the dielectric substrate 31 respectively.

Since the microwave circuit and the antenna element shown in FIGS. 10A and 10B are disposed on the front and back sides of the dielectric substrate 31 respectively at corresponding locations to form a phased array antenna, the disadvantage that the distance between any two adjacent antenna elements in a two-dimensional arrangement is not small will be eliminated.

In addition, the microwave circuit is located directly on the ground over the back side of the dielectric substrate as shown in FIGS. 10A and 10B and is spaced from the antenna element so that interference between the microwave circuit and the antenna element can be prevented.

An ultra-high frequency band radio communications apparatus is disclosed in Jpn. Pat. Appln. KOKAI Publication No. 9-153839 in which a transmitter antenna, a receiver antenna, and a semiconductor chip are mounted in a single package. The transmitter antenna, the receiver antenna, and the semiconductor chip are located on a substrate which is a planer substrate having a single mounting surface. The space where the transmitter and receiver antennas are disposed is communicated with a space of which cut-off frequency is high enough to reject the carrier frequency of the radio communications apparatus. The semiconductor chip is located in an intermediate between the two spaces. The package is covered at top with a non-conductive cap. The intermediate between the two spaces is protected with a layer of a conductive material. The ultra-high frequency band radio communications apparatus disclosed in Jpn. Pat. Appln. KOKAI Publication No. 9-153839 is advantageous in decreasing the overall dimensions as well as reducing the cost of production, compared with the conventional communication systems using the wave-guide techniques.

As a great number of commercial radio apparatuses have widely been marketed, it has been desired to develop and design the lowest cost and most minimized design radio communications systems which may play a major role in the field of large data transmission.

Particularly, personal systems such as namely desk-top personal computers prevail today and some of them are connected to each other for mutual use of data in a network such as LAN.

In such a network, the exchange of data between the personal systems is preferably implemented by means of radio communications in view of the advantage of mobility and the versatility of location of the systems.

It is thus essential for such radio communications systems to be easy in handling and free of the location and method of installation.

In this point of view, the conventional technique in which the devices having the electronic components, except the antenna element, sealed in a casing are utilized in a combination is hardly applicable to the development of millimeter-wave radio communications systems.

If the conventional technique is embodied in a millimeter-wave radio communications system, parasitic factors pertinent to an individual sealed casing are emphasized through higher frequency waves and may be uncontrollable parameters.

In a communications subsystem or radio communications system in which the devices which have the components, except the antenna element, sealed in a single casing are utilized in a combination, the uncontrollable parameters derived from the parasitic factors cause the system performance to hardly reach its desired level.

The constructions disclosed in the Jpn. Pat. Appln. KOKOKU Publication No. 56-17842 or No. 57-44241 is substantially provided with a microwave circuit such as a waveguide and will be unfavorable in the installation in a radio communications system as well as in the mobility and the cost-saving of the same.

It is hence desired that the components including the antenna element are hermetically sealed for maintaining a durability and reliability so that they can be used as a most preferable device in a radio communication system which is thus facilitated in handling and not limited in the location and method of installation.

However, since an electromagnetic wave is radiated from the antenna element, the size of the window through which the electromagnetic wave can transmit is at least three times greater than the size of the antenna element.

In the foregoing prior art, a microwave is used for transmission of signals. When the frequency of the a microwave is 10 GHz, the size of the antenna element is possibly 3 cm.

Accordingly, the size of the electrical wave radiating window is 9 cm hence increasing the overall dimensions of the sealed device of the antenna element provided integrally with the microwave circuit and thus the radio communications system.

With the prior art construction, it is very difficult to provide an antenna element sealed device which is easy in handling and free of the location and method of installation.

According to the prior art devices disclosed in the Jpn. Pat. Appln. KOKAI Publication No. 63-316905 or No. 6-77729, the microwave circuit and the antenna element are mounted on the front and back sides of the substrate respectively in opposite relationship.

In general, the microwave circuit is patterned on a GaAs semiconductor substrate and the antenna element is provided on a dielectric substrate such as ceramic.

For fabricating the prior art device, the two substrates are pasted up to each other so that the microwave circuit is located opposite to the antenna element. This is a troublesome task and will increase the cost of production.

Also, there is developed a problem of thermal dissipation.

The ceramic substrate on which the antenna element is placed is lower by ten times or more in the thermal conductivity than copper or tungsten material and unfavorable to assist radiation of heat from the microwave circuit in the semiconductor device.

In the prior art device disclosed in the Jpn. Pat. Appln. Publication KOKAI No. 9-153839, a semiconductor chip is mounted on the substrate carrying the transmitter and receiver antenna elements. Since the antenna element is provided in a pattern on a dielectric, the substrate has to be made of a dielectric material. The thermal conductivity of a dielectric material is however lower than that of any metal. For example, the thermal conductivity of copper is 381 W/m k while alumina is as low as 21 W/m k.

Also, it is said the package is accompanied with the cap. The semiconductor chip to be mounted is unpackaged, i.e. a bare semiconductor chip. In common, a semiconductor chip has to be hermetically sealed for preventing oxygen and water deterioration to maintain reliability. The hermetical sealing can be adjusted by resistance welding of koval to the leak rate ranging from $10^{-9}$ to $10^{-10}$ (cc/sec 1 atm) or with the use of plastic and araldyte to the leak rate ranging from $10^{-5}$ to $10^{-6}$ (cc/sec 1 atm), for example.

It is common for device experts to provide a semiconductor chip with hermetical sealing but not for radio specialists. For example, some ultra-high frequency band radio communications devices have bare semiconductor chips provided without hermetical sealing as depicted in "C-142 60-GHz band high/ultra high digital transmission receiver module", the Institute of Electronics, Information and Communication Engineers, Aug. 15, 1995, "Microwave semiconductor device", Jpn. Pat. Appln. KOKAI Publication No. 57-141944, "Low-noise amplifier", Jpn. Pat. Appln. KOKAI Publication No. 61-48201, and "A W-band monolithic low noise AlGaAs/InGaAs pseudomorphic HEMT amplifier mounted on a small hermetically sealed package with waveguide interface", 1995 IEEE MTT-S Digest, PP. 207–210.

BRIEF SUMMARY OF THE INVENTION

It is an object of the present invention to provide a semiconductor module with a built-in antenna element for use in, for example, radio communications system or a distance/speed measurement system of a band of millimeter-waves or quasi-millimeter-waves which can eliminate the foregoing prior art disadvantages.

According to an aspect of the present invention, there is provided a semiconductor module having a built-in antenna element for use in a system of a band of millimeter-waves or quasi-millimeter-waves, which comprises: a substrate; an antenna element mounted on one side of the substrate; a semiconductor integrated circuit formed on the same side of the substrate on which the antenna element is mounted, the semiconductor integrated circuit including at least either of a transmitter-signal processing circuit composed mainly of an amplifier circuit and a frequency converter circuit for processing a signal which is exploited in the system of the band of millimeter-waves or quasi-millimeter-waves and transmitted to the antenna element, and a receiver signal processing circuit composed mainly of an amplifier circuit and a frequency converter circuit for processing a signal which is received by the antenna element and exploited in the system of the band of millimeter-waves or quasi-millimeter-waves; and a hermetically sealing means for hermetically sealing the antenna element and the semiconductor integrated circuit formed on the substrate within a common space defined by a boundary surface or the side of the substrate while the transmissivity of radio waves to the antenna element for the system of the band of millimeter-waves or quasi-millimeter-waves is maintained.

According to another aspect of the present invention, there is provided a semiconductor module with a built-in antenna element comprising: an antenna element; an amplifier circuit connected to the antenna element for amplifying a signal of a millimeter-wave or quasi-millimeter-wave; a frequency converter circuit connected to the amplifier circuit; a substrate on one side of which the antenna element, the amplifier circuit, and the frequency converter circuit are mounted; and a hermetically sealing means for hermetically sealing the antenna element, the amplifier circuit, and the frequency converter circuit within a common space.

According to the present invention, the hermetically sealing means of the semiconductor module may be a cover member which is electrically non-conductive in a region opposite to the antenna element but conductive in the other region and is supported to the side of the substrate for hermetical sealing.

According to the present invention, the space defined by the hermetically sealing means may be filled with an inert gas.

According to the present invention, while the substrate on which the antenna element and the semiconductor integrated circuit are provided is an electrically conductive platform, the antenna element and the semiconductor integrated circuit may be formed directly on a semiconductor substrate which is then mounted on the electrically conductive platform.

It is also possible according to the present invention that while the substrate is an electrically conductive platform, at least an area of electrically non-conductive substrate on which the antenna element is formed is separated from an area of electrically non-conductive substrate on which the semiconductor integrated circuit is formed and the electrically non-conductive substrate are then mounted on the electrically conductive platform.

According to the present invention, the antenna element and the semiconductor integrated circuit may be separated from each other by a conductive shielding plate for preventing electromagnetic interference in the space defined by the hermetically sealing means.

According to the present invention, the antenna element in the radio communication semiconductor module is of a flat antenna type.

According to still another aspect of the present invention there is provided a semiconductor module with a built-in antenna element comprising: an antenna element; a semiconductor element to be connected to the antenna element; a substrate on one side of which the antenna element and the semiconductor element are mounted; a hermetically sealing means for hermetically sealing the antenna element and the semiconductor element mounted on the substrate within a common space.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described referring to the accompanying drawings.

Throughout the drawings, like or similar components are denoted by like numerals or signs.

Figure 1:
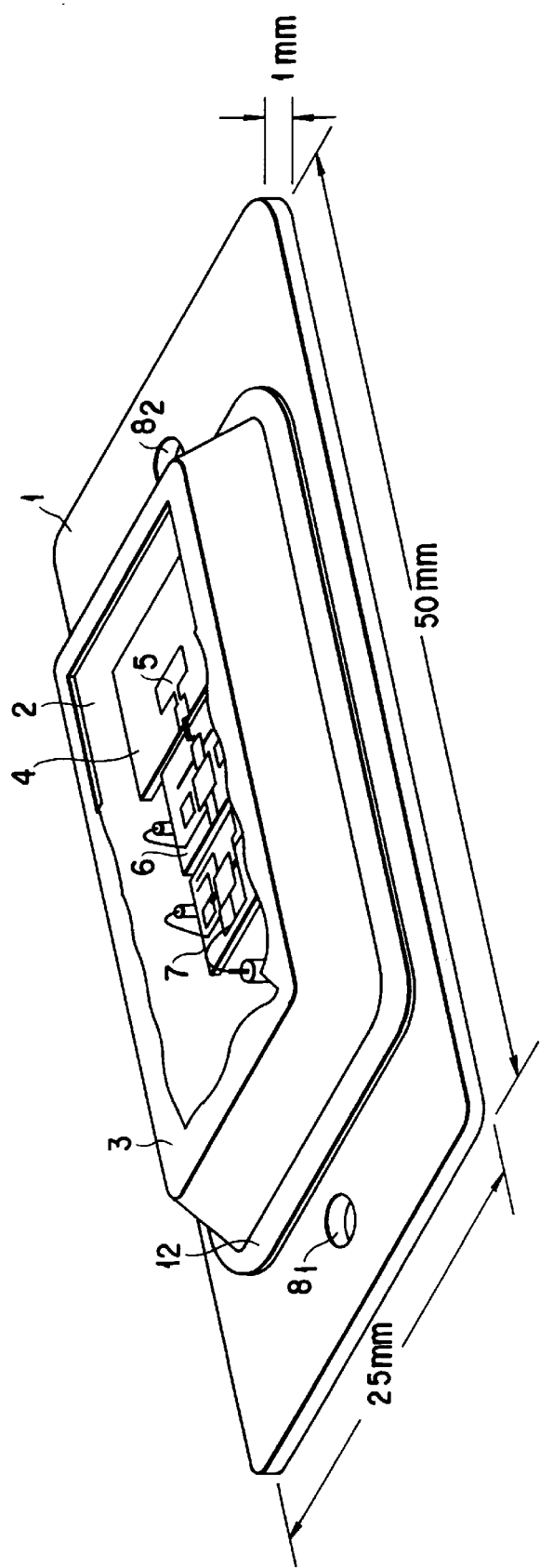
FIG. 1 is a schematic view of a semiconductor module with a built-in antenna element according to an embodiment of the present invention, in which a part of a casing is open for internal view.

FIG. 1 is a schematic perspective view of an embodiment of a semiconductor module for use in a system such as distance measurements or radio communications including a built-in antenna element of the present invention, in which a casing or package is partially opened for internal view.

As shown in FIG. 1, denoted by numeral 1 is a platform made of a metallic material which has higher electrical conductivity and higher thermal conductivity such as copper, iron, and kovar.

The semiconductor module for use in a radio communications system provided with a built-in antenna element according to the present invention is sized with the platform 1 of 25 mm by 50 mm by 1 mm thick, for example.

Denoted by numeral 3 is a sealing cover made of an electrically conductive material for hermetically sealing a primary part with its sealing rim 12 joined to the platform 1 by soldering, laser welding, resistance welding, or a combination of screws and a packing.

The sealing cover 3 is made of an electrically conductive material like that of the platform 1.

The sealing cover 3 has a window 2 provided therein through which the electromagnetic wave can propagate.

The electromagnetic wave window 2 incorporates a sheet of a dielectric material installed integrally for transmission of an electromagnetic wave.

The process of hermetical sealing is carried out in the atmosphere of inert gas such as nitrogen, permitting the sealing rim 12 to trap a dose of inert gas.

As the result, the internal environment of the semiconductor module with the built-in antenna element according to the present invention becomes stable thus contributing to the long-life of the radio communications system or the distance measurements system.

Referring to FIG. 1, there are screw holes 18 and 82 provided in the semiconductor module with the built-in antenna element for mounting it to another apparatus.

The antenna element 4 includes a dielectric substrate denoted by numeral 44 and an antenna pattern denoted by numeral 5 made of a thin metal film.

Denoted by numerals 6 and 7 are a couple of semiconductor integrated circuits which include a microwave circuit and a millimeter-wave or quasi-millimeter-wave circuit respectively in IC form on GaAs semiconductor substrates.

As apparent from FIG. 1, the antenna element 4 and the two semiconductor integrated circuits 6 and 7 according to the present invention are mounted on one side of the platform 1.

Figure 2A:
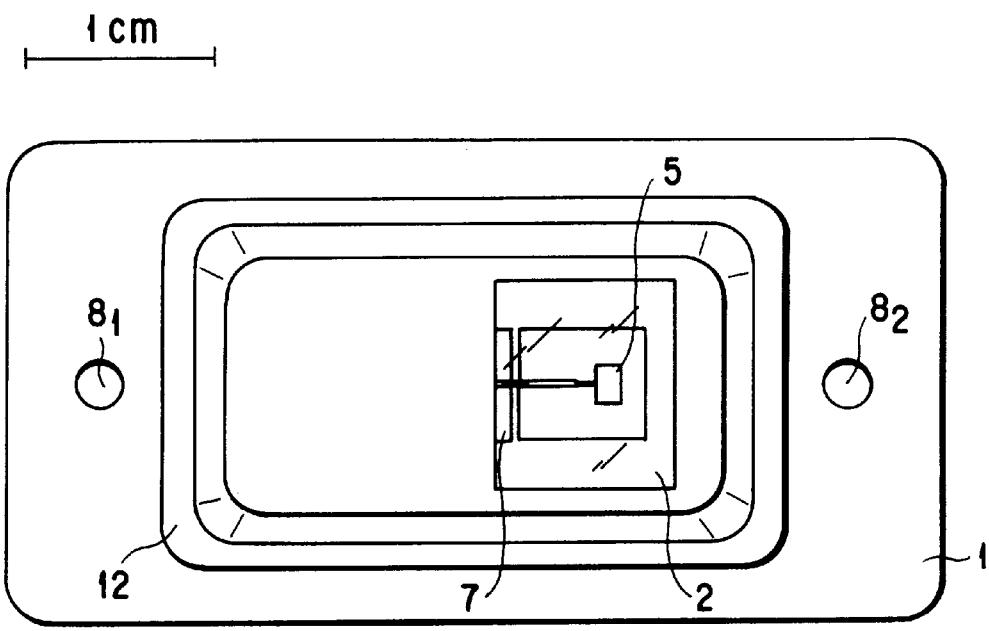
FIGS. 2A and 2B are a top view and a cross sectional view respectively showing the semiconductor module with a built-in antenna element of the embodiment shown in FIG. 1.
Figure 2B:
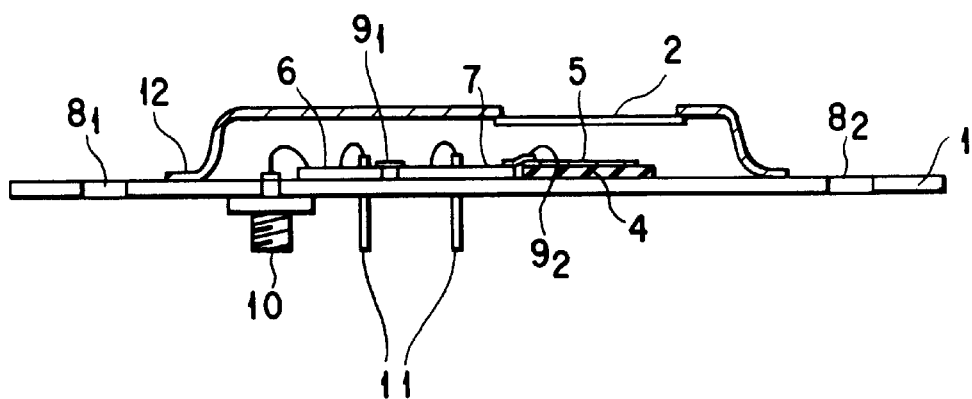

The above arrangement is now explained in more detail referring to FIGS. 2A and 2B.

FIGS. 2A and 2B are a top view and a cross sectional view of the semiconductor module with the built-in antenna element shown in FIG. 1.

As understood from FIG. 2A, the antenna element 4 is mounted on the dielectric substrate 44 and located opposite to the electromagnetic wave window 2.

The antenna element 4 includes a dielectric substrate denoted by numeral 44 and an antenna pattern denoted by numeral 5 made of a thin metal film.

With the use of the flat antenna type, the antenna element 4 can be minimized in size and packaged integrally with the semiconductor integrated circuits 6 and 7. As shown in FIG. 2B, the antenna pattern 5 formed on the substrate of the antenna element 4 is illustrated with a thick.

A wiring pattern exists on the substrate of the semiconductor chip similar to the above but it is omitted in FIG. 2B to avoid complexity.

Figure 3:
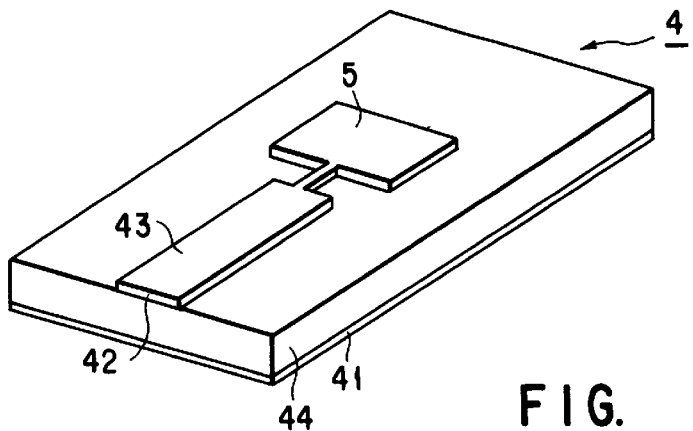
FIG. 3 is a view of an example of the antenna element which is of patch antenna type.

FIG. 3 illustrates an example of the patch antenna type of the antenna element 4.

As shown in FIG. 3, a dielectric substrate 44 is a quartz sheet having a thickness of 200 to 500 micrometers, for example.

Also shown are a ground 41 comprises a metal film of a few micrometers deposited entirely to the back side of the dielectric substrate 44.

The antenna pattern 5 of the antenna element 4 is formed of a metallic film of a few micrometers thick.

The patch size of the antenna pattern 5 corresponds to the wavelength of a signal to be used.

Accordingly, the size of the dielectric substrate 44 is several times greater than the patch size of the antenna pattern 5 but is limited by the overall dimensions of the semiconductor module with the built-in antenna element of the embodiment.

Referring to FIG. 3, a power supply port 42 is provided for feeding power via a strip line 43 to the antenna pattern 5.

It is assumed that the angle of wave radiation on the single antenna pattern 5 is 60 degrees.

Returning to FIGS. 2A and 2B, the semiconductor integrated circuits 6 and 7 are mounted on a semiconductor substrate which is separated from the antenna element 4.

The semiconductor substrates on which the semiconductor integrated circuits 6 and 7 are mounted and the antenna element 4 is mounted are provided on a common side of the platform 1.

The semiconductor integrated circuit 6 and 7 are electrically connected by leads $9_1$ and $9_2$ to the antenna pattern 5.

As shown in FIG. 2B, there are provided an IF signal input 10 and a power input 11.

The IF signal supplied to the IF signal input 10 is fed to the semiconductor integrated circuit 6.

Bias voltages are supplied via the power input 11 to the semiconductor integrated circuits 6 and 7 4A respectively.

Figure 4A:
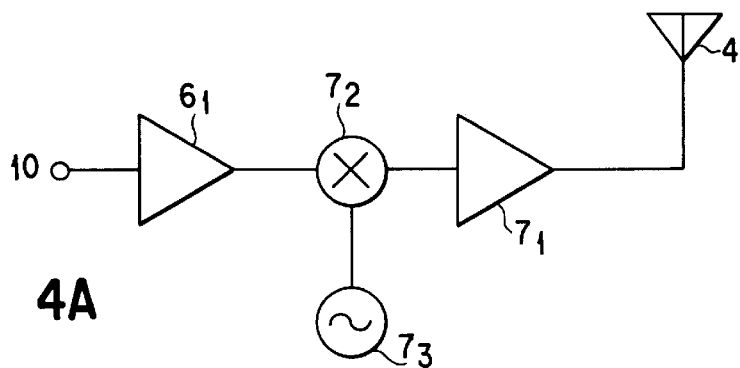
FIG. 4A is a diagram of an equivalent circuit in the embodiment shown in FIG. 2.

FIG. 4A shows an equivalent circuit in the embodiment shown in FIGS. 2A and 2B.

As shown in FIG. 4A, the intermediate frequency (IF) signal supplied to the IF signal input 10 is amplified by an IF amplifier $6_1$.

A frequency mixer circuit $7_2$ and a local oscillator circuit $7_3$ are provided serving in a combination as a frequency converter circuit.

The IF signal amplified by the IF amplifier circuit $6_1$ is transmitted to the frequency mixer circuit $7_2$ of the frequency converter circuit where it is used for modulating a carrier frequency signal fed from the local oscillator circuit $7_3$ and a resultant modulated signal is sent to a power amplifier $7_1$.

The high frequency output of the power amplifier $7_1$ is then radiated from the antenna element 4.

While the bias voltages are supplied from the power input 11 to the IF amplifier $6_1$ and the power amplifier $7_1$, driving voltage is fed to the frequency mixer circuit $7_2$ and the local oscillator circuit $7_3$.

The IF amplifier $6_1$ is the semiconductor integrated circuit 6 in this embodiment.

Although the power amplifier $7_1$, the frequency mixer circuit $7_2$, and the local oscillator circuit $7_3$ are integrated in the semiconductor integrated circuit 7, they may be implemented by separate semiconductor devices.

It would be understood that the equivalent circuit shown in FIG. 4A is a transmitter signal processing circuit T when the semiconductor module shown in FIGS. 1, 2A, and 2B serves as a radio transmitter or a receiver signal processing circuit when it acts as a radio receiver.

Figure 4B:
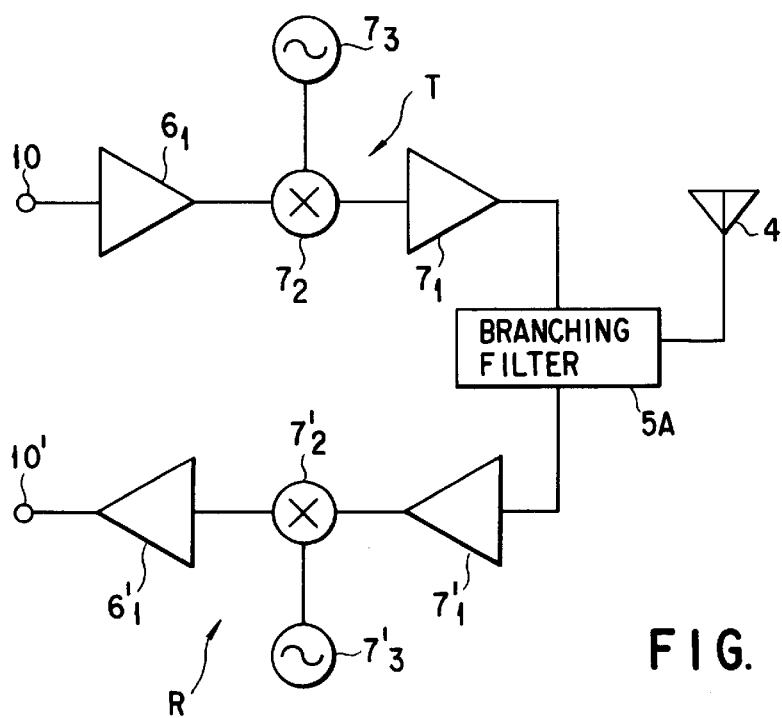
FIGS. 4B and 4C are diagrams of another and still another equivalent circuits in the embodiment shown in FIG. 2.

Alternately, as shown in FIG. 4B, the antenna element 4 handles a band of frequencies, a branching filter 5A may be connected between the power amplifier $7_1$ and the antenna element 4 while a received signal processing circuit R is provided which corresponds to the transmitter signal processing circuit T shown in FIG. 4A and comprises a low-noise amplifier 7', a frequency mixer circuit $7_2$', a local oscillator circuit $7_3$', and an IF amplifier $6_1$'.

Figure 4C:
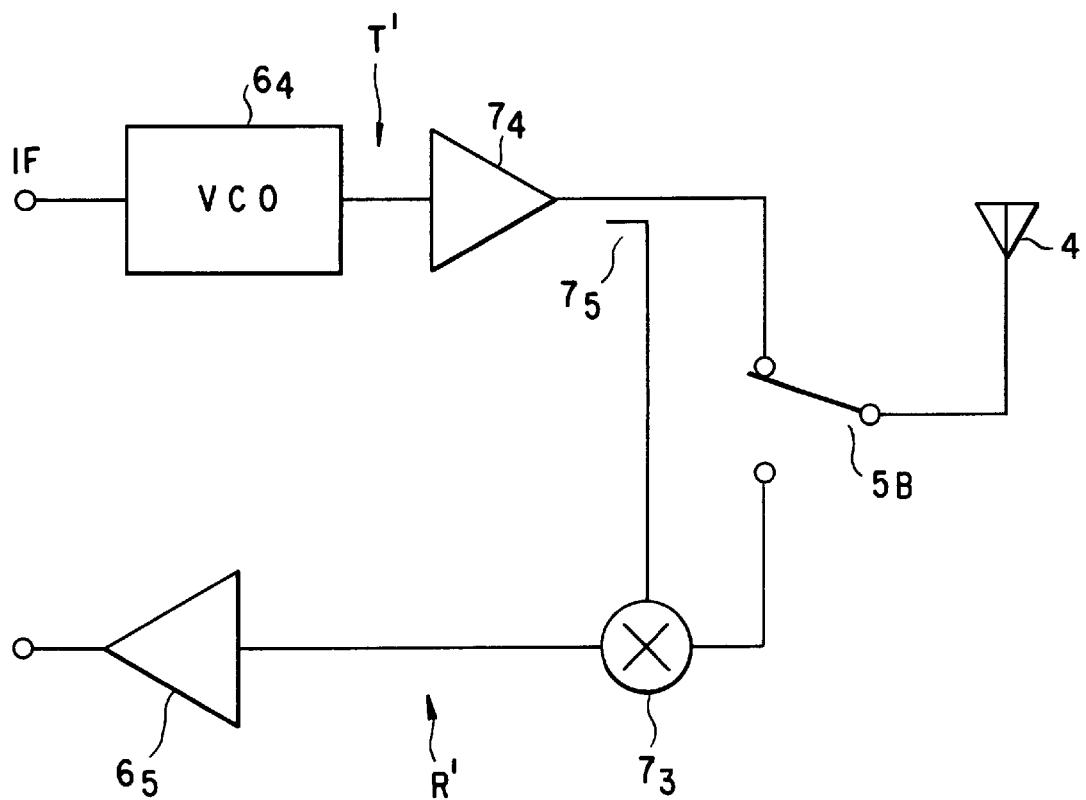

Alternately, as shown in FIG. 4C, the branching filter 5A of FIG. 4B may be replaced with a switch 5B while a receiver R' corresponding to the receiver signal processing circuit R shown in FIG. 4A is incorporated having a voltage controlled oscillator (VCO) $6_4$, an amplifier $7_4$, and a coupler $7_5$, a frequency mixer circuit $7_3$, and an amplifier $6_5$. In this case, the semiconductor module can be used in a measuring system for measurement of the speed and the distance between automobiles.

It is further possible according to the principles of the present invention that when two or more bands of frequencies are used, the antenna can be arranged in a group of frequency corresponding modules.

As described above, the embodiment of the present invention shown in FIGS. 1, 2A and 2B has no waveguide connected between the antenna element 4 and the signal processor composed of the semiconductor integrated circuit 6 and 7 thus minimizing the overall size and the cost of the semiconductor device module.

Also, the antenna element 4 is hermetically sealed hence contributing to the higher stability and durability of the device.

Figure 5:
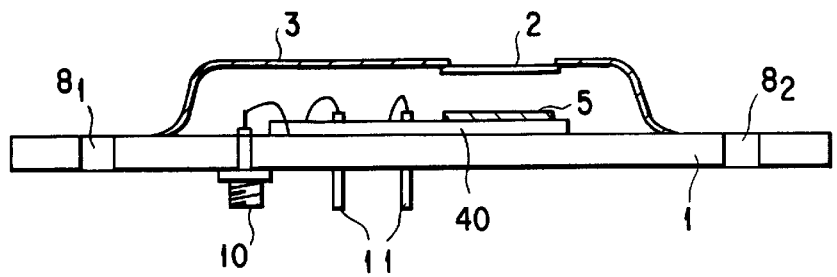
FIG. 5 is a schematic view of a semiconductor module with a built-in antenna element according to another embodiment of the present invention

FIG. 5 illustrates another embodiment of the semiconductor module with the built-in antenna element according to the present invention.

As compared with the construction shown in FIG. 2B where the antenna pattern 5 and the two semiconductor integrated circuits 6 and 7 are mounted on their respective substrates, the arrangement shown in FIG. 5 permits those components to be placed on a common semiconductor substrate 40.

In a radio communications system, the radiating pattern of an antenna is varied depending on its application.

It is advantageous of the embodiment shown in FIGS. 2A and 2B that the antenna element 4 and the semiconductor integrated circuits 6 and 7 are mounted on their respective substrates allowing mass production of the semiconductor module.

On the other hand, the other embodiment shown in FIG. 5 permits the antenna pattern 5 and the semiconductor integrated circuits 6 and 7 are mounted on the same substrate thus eliminating the need of connection between chips.

The embodiment shown in FIG. 5 allows all the components to be fabricated in consistency thus decreasing the cost of production as well as contributing to the reduction of power loss and the improvement of reliability of the circuits.

Figure 6:
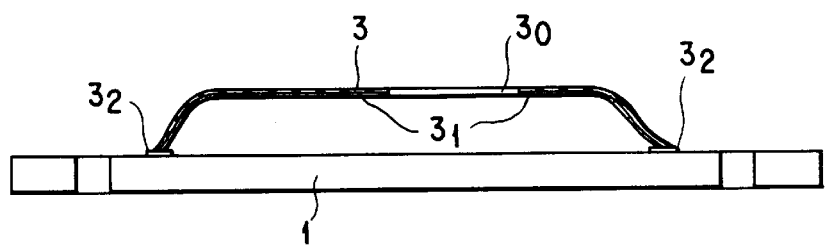
FIG. 6 is a view showing a modification of the sealing cover of the embodiment shown in FIG. 1.

Illustrated in FIG. 6 is a modification of the sealing cover 3 shown in FIG. 1.

FIG. 6 is a cross sectional view similar to FIG. 5, in which the antenna element 4 and the semiconductor integrated circuits 6 and 7 are not shown in the sealing cover 3.

The sealing cover 3 shown in FIG. 6 is made of a non-conductive material and coated entirely with a conductive metallic plating $3_1$ except an electromagnetic wave window 30.

The sealing cover 3 is bonded by an electrically conductive adhesive 32 to the platform 1 for hermetical sealing.

The conductive adhesive 32 permits the sealing cover 3 and the platform 1 to be identical in potential. Accordingly, the electromagnetic shielding effect of the sealing cover 3 is equal to that of the conductive sealing cover 3 of the previous embodiment shown in FIG. 1.

As electrical waves dissipate about the antenna element 41 a portion of them from the antenna element 4 may cause electromagnetic interference on the semiconductor integrated circuits 6 and 7 sealed in the common space.

On the contrary, unwanted radiation of electromagnetic waves from the semiconductor integrated circuits 6 and 7 may interrupt a radiating pattern from the antenna element 4.

Figure 7A:
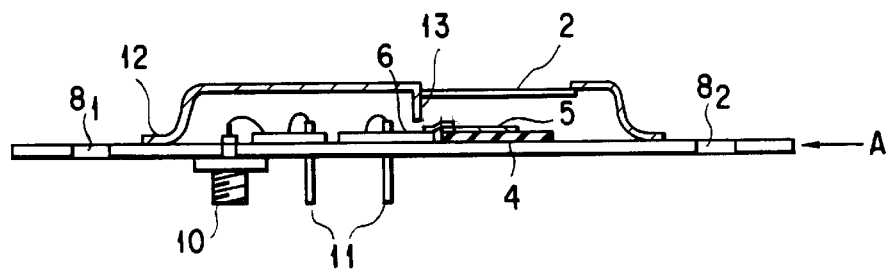
FIGS. 7A and 7B are views of a semiconductor module with a built-in antenna element according to a further embodiment of the present invention.
Figure 7B:
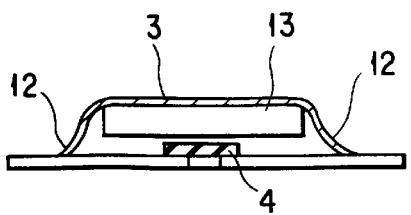

FIGS. 7A and 7B show a further embodiment for preventing the electromagnetic interference.

FIG. 7A is a cross sectional view similar to FIG. 2A and FIG. 7B is a cross sectional view seen from the direction denoted by the arrow A of FIG. 7A.

The embodiment shown in FIG. 7A is distinguished from the preceding embodiments by the fact that an electromagnetic shielding plate 13 is provided between the antenna element 4 and the semiconductor integrated circuit 7.

The electromagnetic shielding plate 13 is made of the same material as of the sealing cover 3 which is electrically conductive except its electromagnetic wave window 2 and is joined at uppermost to the sealing cover 3.

The lowermost of the electromagnetic shielding plate 13 is arranged to clear inter-chip lines $9_1$ and $9_2$ and leads of the semiconductor integrated circuit 7.

This arrangement shown in FIG. 7A can eliminate the electromagnetic interference.

Figure 8A:
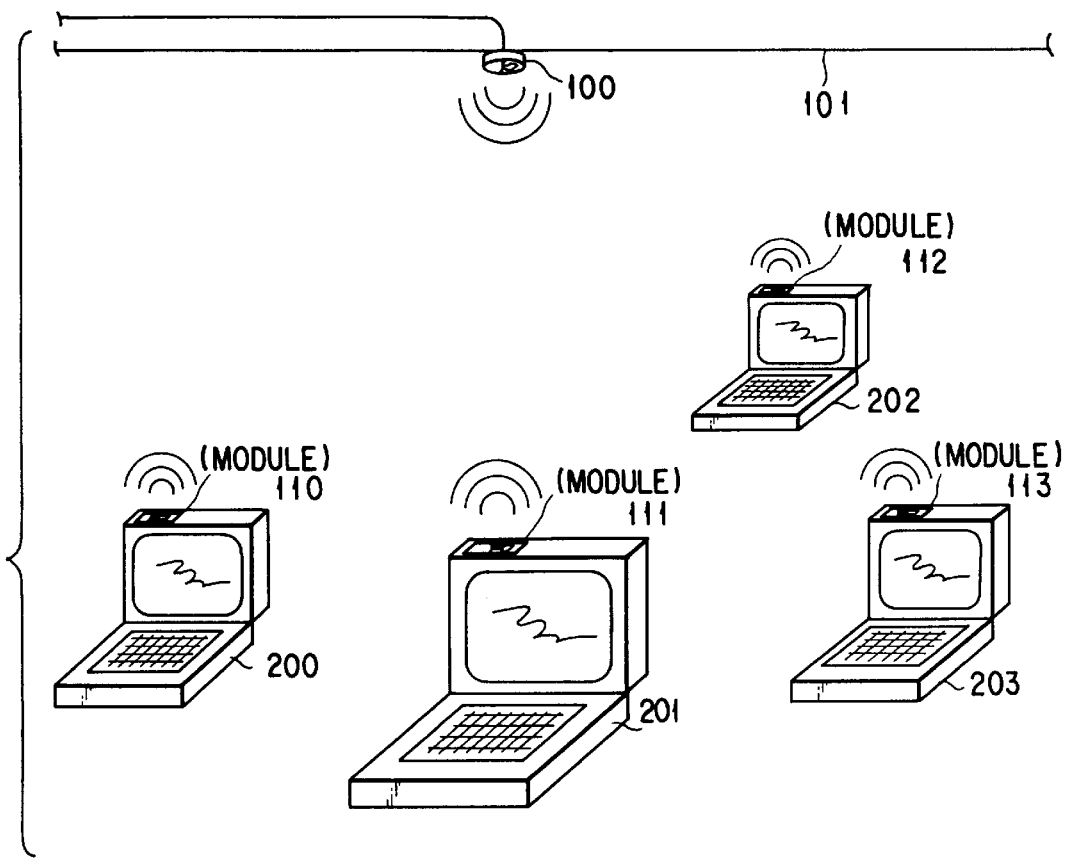
FIGS. 8A and 8B are views showing an application of the semiconductor module with a built-in antenna element according to the present invention.
Figure 8B:
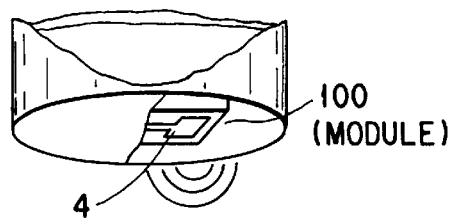
Figure 9A:
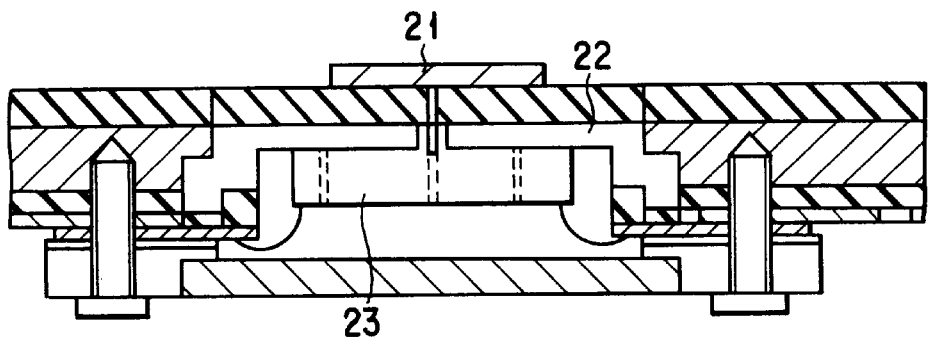
FIGS. 9A and 9B are views showing a prior art arrangement in which one of antenna elements constituting a phased array antenna is connected to a microwave circuit.
Figure 9B:
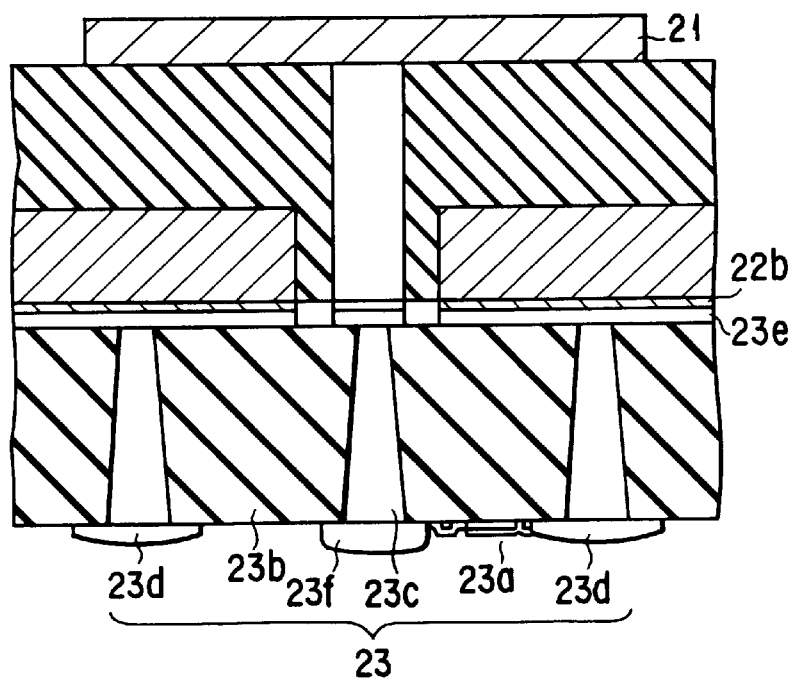
Figure 10A:
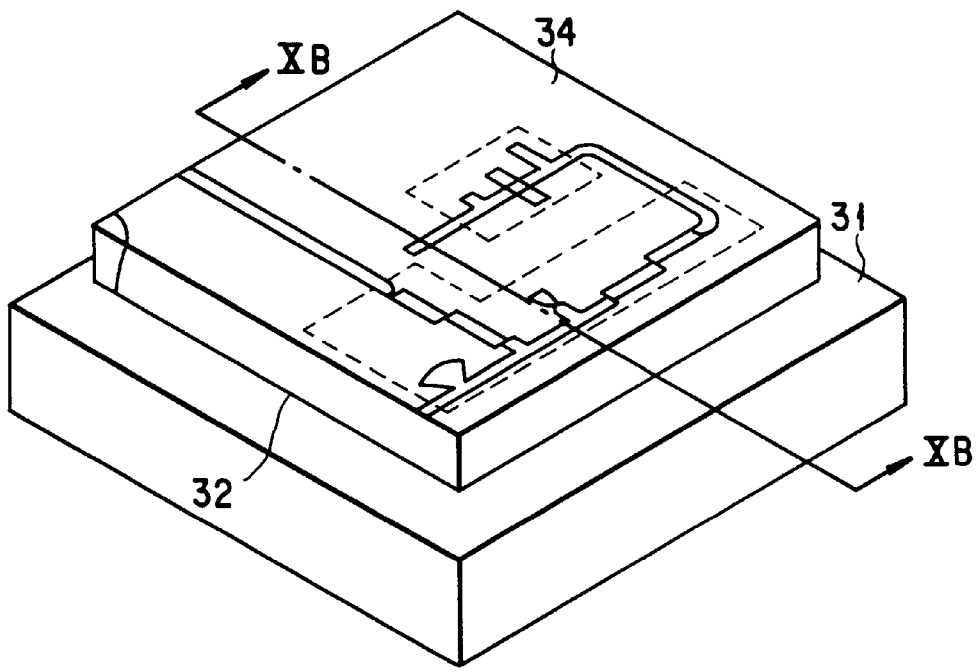
FIGS. 10A and 10B are views showing a prior art arrangement, similar to that shown in FIGS. 9A and 9B, in which one of antenna elements constituting a phased array antenna is integrated with a microwave circuit.
Figure 10B:
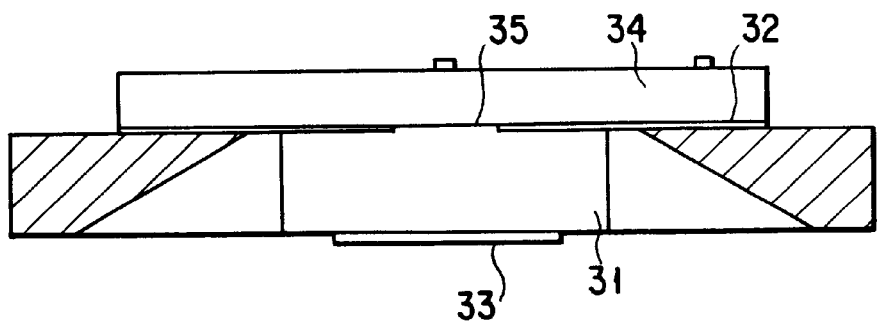

FIGS. 8A and 8B show an application of the semiconductor module with a built-in antenna including the equivalent circuit of FIG. 4B.

As shown in FIGS. 8A and 8B, a radio communication semiconductor module with a built-in antenna denoted by numeral 100 built in the antenna element 4 is mounted to a ceiling 101 of e.g. an office room.

Denoted by numerals 200 to 203 are personal computers which include the radio communication semiconductor modules 110 to 113 of the present invention, respectively.

Accordingly, exchange of data can be done in wireless between the personal computers 200 to 203 or between any of the personal computers 200 to 203 and a host computer not shown via the radio communication semiconductor module 100 mounted to the ceiling 101.

As set forth above in conjunction with the relevant drawings, the semiconductor module with a built-in antenna suited for exploiting a band of millimeter-waves or quasi-millimeter-waves is implemented according to the present invention.

The semiconductor module with a built-in antenna of the present invention is applicable to a small-sized communications system and can be used as a sub system in a multi-media radio communications system for exchange of large amounts of information under various environmental conditions.

The features of the present invention defined in the appended claims are now explained individually.

According to the feature defined in claims 1, 8 and 15, the antenna element and the semiconductor integrated circuits or elements (or a combination of the frequency converter and the amplifier) for a band of millimeter-waves or quasi-millimeter-waves are mounted on one side of the substrate and hermetically sealed in.

Since the antenna element tailored to a few millimeter size is hermetically sealed in together with the semiconductor integrated circuits (or a combination of the frequency converter and the amplifier), the semiconductor module will be enhanced in the ease of handling and the durability.

Also, the antenna element and the semiconductor integrated circuits or element (or a combination of the frequency converter and the amplifier) are mounted on. the same side of the substrate and can hermetically be sealed with the use of a single cover.

According to the feature defined in claims 2 and 9, the hermetical sealing is implemented by supporting to the substrate the cover member which is electrically non-conductive in a portion opposite to the antenna element but conductive in the other portions.

This provides the electromagnetic shielding of the frequency converter and amplifier circuits and the radiation of electric waves from the antenna element to the outside of the module simultaneously.

According to the feature defined in claims 3 and 10, the hermetical sealing is accompanied with an inert gas.

This allows the interior of the module to be stable in environment and to be increased in the operating life, thus ensuring stable performance of the module such as a radio communication device or a distance/speed measurement apparatus.

According to the feature defined in claims 4 and 11, while the substrate is a conductive platform, the antenna element and the frequency converter and amplifier circuits are formed on a common semiconductor substrate which is then mounted on the conductive platform.

This allows the antenna element and the frequency converter and amplifier circuits to be fabricated at once on the same semiconductor substrate, hence minimizing the time of production and decreasing the cost of production.

According to the feature defined in claims 5 and 12, while the substrate is a conductive platform, at least the antenna element is formed on a dielectric substrate which is separated from another substrate on which the circuits are formed and the dielectric substrate is mounted on the conductive platform.

This allows the antenna element to be fabricated separately of the frequency converter and amplifier circuits, thus providing versatility in the design of the antenna element as well as the frequency converter and amplifier circuits.

As the result, the module can easily be modified to desired specifications.

According to the feature defined in claims 6 and 13, the conductive shielding plate is provided between the antenna element and the frequency converter and amplifier circuits for preventing the electromagnetic interference between the same. This permits the antenna element and the frequency converter and amplifier circuits to be mounted in the same space without suffering from the electromagnetic interference.

According to the feature defined in claims 7 and 14, the antenna element is formed of a flat antenna type.

The flat antenna element is small in the overall dimensions and thus favorable in the hermetical sealing together with the frequency converter and amplifier circuits.

As set forth above, the present invention provides an improved semiconductor module having a built-in antenna element for use in such as a radio communications system or a distance/speed measurements system of a band of millimeter-waves or quasi-millimeter-waves, which is capable of eliminating the disadvantages of the prior art.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor module having a built-in antenna element for use in a system of a band of millimeter-waves or quasi-millimeter-waves, comprising:

a substrate;

an antenna element mounted on a side of said substrate;

a semiconductor integrated circuit formed on the same side of said substrate, said semiconductor integrated circuit including at least one of (i) a transmitter signal processing circuit comprising an amplifier circuit and a frequency converter circuit for processing a signal which is exploited in the system of said band of millimeter-waves or quasi-millimeter-waves and transmitted to said antenna element, and (ii) a receiver signal processing circuit comprising an amplifier circuit and a frequency converter circuit for processing a signal which is received by the antenna element and exploited in the system of the band of millimeter-waves or quasi-millimeter-waves; and a hermetically sealing means for hermetically sealing said antenna element and said semiconductor integrated circuit within a common space defined by one of a boundary surface and the side of the substrate;

wherein said hermetically sealing means comprises a window for maintaining a transmissivity of radio waves to said antenna element for the system of the band of millimeter-waves or quasi-millimeter-waves; and wherein said substrate comprises an electrically conductive platform. and said antenna element and said semiconductor integrated circuit are mounted on one side of the electrically conductive platform.

2. A semiconductor module according to claim 1, wherein said hermetically sealing means comprises a cover member which is electrically non-conductive in a region of the window opposite to said antenna element but conductive in other regions, and said cover is supported by the side of the substrate.

3. A semiconductor module according to claim 1, wherein said common space within which said antenna element and said semiconductor integrated circuit are hermetically sealed is filled with an inert gas.

4. A semiconductor module according to claim 1, wherein said antenna element and the semiconductor integrated circuit are formed directly on a semiconductor substrate which is mounted on the electrically conductive platform.

5. A semiconductor module according to claim 1, wherein an electrically non-conductive substrate is mounted on said electrically conductive platform, and said antenna element is formed on an area of the electrically non-conductive substrate which is separated from an area of the electrically non-conductive substrate on which the semiconductor integrated circuit is formed.

6. A semiconductor module according to claim 1, wherein said antenna element and said semiconductor integrated circuit are separated from each other by a conductive shielding plate for preventing electromagnetic interference in said common space within which said antenna element and said semiconductor integrated circuit are hermetically sealed.

7. A semiconductor module according to claim 1, wherein said antenna element is flat antenna.

8. A semiconductor module having a built-in antenna element comprising:

an antenna element;

an amplifier circuit connected to said antenna element for amplifying a signal of a millimeter-wave or quasi-millimeter-wave;

a frequency converter circuit connected to said amplifier circuit;

a substrate on one side of which said antenna element, said amplifier circuit, and said frequency converter circuit are mounted; and a hermetically sealing means for hermetically sealing said antenna element, the amplifier circuit, and the frequency converter circuit within a common space;

wherein said hermetically sealing means comprises a window for maintaining a transmissivity of radio waves to said antenna element for the system of the band of millimeter-waves or quasi-millimeter-waves; and wherein said substrate comprises an electrically conductive platform, and said antenna element, said amplifier circuit, and said frequency converter circuit are mounted on one side of the electrically conductive platform.

9. A semiconductor module according to claim 8, wherein the hermetically sealing means comprises a cover member which is electrically non-conductive in a region of the window opposite to the antenna element but conductive in other regions, and said cover is supported by the side of the substrate.

10. A semiconductor module according to claim 8, wherein said common space is filled with an inert gas.

11. A semiconductor module according to claim 8, wherein said antenna element, the amplifier circuit, and the frequency converter circuit are formed directly on a semiconductor substrate which is mounted on said electrically conductive platform.

12. A semiconductor module according to claim 8, wherein an electrically non-conductive substrate is mounted on said electrically conductive platform, and the antenna element is formed on an area of the electrically non-conductive substrate which is separated from an area of the electrically non-conductive substrate on which the amplifier and frequency converter circuits are formed.

13. A semiconductor module according to claim 8, wherein said antenna element and said amplifier and frequency converter circuits are separated from each other by a conductive shielding plate for preventing electromagnetic interference in said common space.

14. A semiconductor module according to claim 8, wherein said antenna element is a flat antenna.

15. A semiconductor module with a built-in antenna element comprising:

an antenna element;

a semiconductor element to be connected to said antenna element;

a substrate on one side of which said antenna element and said semiconductor element are mounted;

a hermetically sealing means for hermetically sealing said antenna element and said semiconductor element mounted on said substrate within a common space;

wherein said hermetically sealing means comprises a window for maintaining a transmissivity of radio waves to said antenna element for a system of a band of millimeter-waves or quasi-millimeter-waves; and wherein said substrate comprises an electrically conductive platform, and said antenna element and said semiconductor element are mounted on one side of the electrically conductive platform.

* * * * *